United States Patent
Phan et al.

(10) Patent No.: US 6,622,547 B1
(45) Date of Patent: Sep. 23, 2003

(54) SYSTEM AND METHOD FOR FACILITATING SELECTION OF OPTIMIZED OPTICAL PROXIMITY CORRECTION

(75) Inventors: Khoi Phan, San Jose, CA (US); Ramkumar Subramanian, San Jose, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/196,797

(22) Filed: Jul. 17, 2002

Related U.S. Application Data

(62) Division of application No. 09/540,364, filed on Mar. 31, 2000.

(51) Int. Cl.$^7$ .............................. G01B 5/08; G03F 9/00
(52) U.S. Cl. ....................................................... 73/105
(58) Field of Search ........................................... 73/105

(56) References Cited

U.S. PATENT DOCUMENTS

| | | | |
|---|---|---|---|
| 5,705,301 A | 1/1998 | Garza et al. | 430/5 |
| 5,723,233 A | 3/1998 | Garza et al. | 430/5 |
| 5,740,068 A | 4/1998 | Liebmann et al. | 716/21 |
| 5,962,173 A | 10/1999 | Leroux et al. | 430/5 |
| 6,016,201 A | 1/2000 | Lin et al. | 356/388 |
| 6,033,811 A | 3/2000 | Lee | 430/5 |
| 6,373,975 B1 | 4/2002 | Bula et al. | 382/144 |

*Primary Examiner*—Daniel S. Larkin
(74) *Attorney, Agent, or Firm*—Amin & Turocy, LLP

(57) ABSTRACT

A system and method for evaluating optical proximity corrected (OPC) designs is provided. The system includes an AFM measurement system for performing measurements relating to a segment of a feature pattern corresponding to a predetermined OPC mask feature. The measurement system is configured to determine a first image for the segment of the printed feature based upon the measurements. The measurement system compares the first image with another image corresponding to different OPC design to evaluate performance characteristics of the respective OPC designs.

6 Claims, 8 Drawing Sheets

SYSTEM AND METHOD FOR FACILITATING SELECTION OF OPTIMIZED OPTICAL PROXIMITY CORRECTION

This is a division of application Ser. No. 09/540,364 filed Mar. 31, 2000.

FIELD OF THE INVENTION

The present invention generally relates to photolithography process development, and more particularly relates to a system and method for selecting one of various available OPC designs for a feature pattern based upon evaluation of measurement data obtained using, for example, atomic force microscopy.

BACKGROUND OF THE INVENTION

The minimum feature sizes of integrated circuits are continuously decreasing in order to increase the packing density of the various semiconductor devices formed thereby. With this size reduction, however, various steps within the integrated circuit fabrication process become more difficult. One such area within the semiconductor fabricating process which experiences unique challenges as feature sizes shrink is photolithography.

Photolithography involves selectively exposing regions of a resist-coated silicon wafer to form a radiation pattern thereon. Once exposure is complete, the exposed resist is developed in order to selectively expose and protect the various regions on the silicon wafer defined by the exposure pattern (e.g., silicon regions in the substrate, polysilicon on the substrate, or insulating layers such as silicon dioxide).

An integral component of a photolithography or pattern transfer system is a reticle (often called a mask) which includes a pattern thereon corresponding to features to be formed in a layer on the substrate. A reticle typically includes a transparent glass plate covered with a patterned light blocking material such as chrome. The reticle is placed between a radiation source producing radiation of a preselected wavelength (e.g., ultraviolet light) and a focusing lens which may form part of a stepper apparatus. Placed beneath the stepper is the resist-coated silicon wafer. When the radiation from the radiation source is directed onto the reticle, light passes through the glass (in the regions not containing the chrome mask patterns) and projects onto the resist-coated silicon wafer. In this manner, an image of the reticle is transferred to the resist.

The resist (sometimes referred to as the "photoresist") is provided as a thin layer of radiation-sensitive material that is typically spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it is to be understood that negative resists may be substituted therefor.

An exemplary prior art reticle is illustrated in FIG. 1. Prior art FIG. 1 includes a reticle 10 corresponding to a desired integrated circuit pattern 12. For simplicity, the pattern 12 consists of only two design mask patterns. A clear reticle glass 14 allows radiation to project onto a resist-coated silicon wafer. The chrome regions 16 and 18 on the reticle 10 block radiation to generate an image on the wafer corresponding to the desired integrated circuit design features.

As light passes through the reticle 10, it is refracted and scattered by the edges of the chrome 16 and 18. This causes the projected image to exhibit some rounding and other optical distortion. While such effects pose relatively little difficulty in layouts with large features (e.g., features with critical dimensions greater than one micron), they may not be ignored in present day circuit layouts where critical dimensions are about 0.25 micron or smaller. The problem highlighted above becomes even more pronounced in integrated circuit designs having submicron feature sizes near the wavelength of the radiation employed in the photolithographic process.

Prior art FIG. 2 illustrates the impact of the diffraction and scattering caused by the radiation passing through the reticle 10 and onto a section of a photoresist-covered silicon substrate 20. As illustrated, the illumination pattern on the substrate 20 contains an illuminated region 22 and two dark regions 24 and 26 corresponding to the chrome regions 16 and 18 on the reticle 10. The illuminated pattern 22, however, exhibits considerable distortion, with the dark regions 24 and 26 having their corners 28 rounded. Unfortunately, any distorted illumination pattern propagates through the developed resist pattern and negatively impacts the integrated circuit features, such as polysilicon gate regions, vias in dielectrics, etc. As a result, integrated circuit performance is degraded.

To remedy this problem, a reticle correction technique known as optical proximity correction (OPC) has been developed. OPC involves the adding of dark regions to and/or the subtracting of dark regions from portions of a reticle to mitigate the distorting effects of diffraction and scattering. Typically, OPC is performed on a digital representation or simulation of a desired integrated circuit pattern. The digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Prior art FIG. 3 illustrates how OPC may be employed to modify the reticle design illustrated in FIG. 1 and thereby provide more accurately the desired illumination pattern at the substrate. As shown, an OPC-corrected reticle 30 includes two features 32 and 34 outlined in chrome on the glass plate 36. Various corrections 38 and 40 have been added to the base features. Some correction takes the form of "serifs." Serifs are typically small, appendage-type addition or subtraction regions typically made at corner regions or other areas on reticle designs.

Prior art FIG. 4 illustrates an illumination pattern 50 produced on a photoresist-covered wafer surface 52 by radiation passing through the reticle 30 of prior art FIG. 3. As shown, the illuminated region includes a light region 54 surrounding a set of dark regions 56 and 58 which substantially faithfully represent the desired pattern illustrated in prior art FIG. 1. Note that the illumination pattern 22 of prior art FIG. 2 which was not produced with a reticle having OPC (reticle 10) has been improved greatly by the reticle 30 having OPC.

Although OPC designs provide performance improvements over features which do not employ OPC as illustrated in prior art FIGS. 1–4, presently it is difficult to determine which OPC design is the optimal design for a given feature, even with the most advanced simulation equipment. As illustrated in prior art FIG. 5, a feature 60 on a mask 62 has a core portion 64 with an OPC design 66 applied thereto. The OPC design 66, however, may include different types of serifs 68a, 68b of various dimensions at various locations about the feature 60. For example, the serif 68a may attach to the core portion 64 at various points and thus may vary substantially in its dimensions. In addition, the serif 68b may have a variable width, a variable length, and may exist at various distances away from the core portion 64. Presently, however, there is not an efficient way of evaluating whether one type of OPC design is better than another in achieving its goal, namely to produce a feature pattern on a substrate which substantially approximates an ideal feature pattern 70, as illustrated in prior art FIG. 6.

Another problem associated with the analysis of OPC designs for a given feature is in analyzing the mask fabrication process which is employed in fabricating the mask. As illustrated in prior art FIG. 7, a portion of mask layout data associated with a core feature 80 having an OPC design 82 is used to generate a pattern on a mask (i.e., a mask pattern). As illustrated in prior art FIG. 7, different mask fabrication processes for a given feature result in mask patterns that approximate the intended feature having the OPC, but nevertheless differ from one another. For example, the mask pattern 86 formed by the mask fabrication process A of prior art FIG. 7 may have been generated using a dry etch while the mask pattern 88 formed by the mask fabrication process B may have been generated using a wet etch which caused the mask patterns 86 and 88 to differ. Given the fact that different mask fabrication processes provide mask patterns which approximate the intended OPC design, but differ from one another, one must evaluate which mask fabrication process is the optimal process to utilize in order to maximize the benefits provided by OPC.

SUMMARY OF THE INVENTION

The present invention relates to a system and method of characterizing feature patterns having optically corrected designs by employing an atomic force microscopy (AFM) system for non-linear and non-symmetric critical dimension (CD) measurements. More specifically, the AFM system is configured to provide CD measurements over regions of an optical proximity correction (OPC) corrected feature pattern. The CD measurements from different OPC corrected feature patterns are analyzed to determine which OPC correction provides the closest to the intended design. Based upon the analysis, an optimal OPC design and/or process may be rapidly and efficiently selected. Thus, painstaking manual analysis of critical dimension data as provided by prior art methods is substantially mitigated, and subjective interpretation of the critical dimension measurements is substantially eliminated.

According to one aspect of the present invention, a system and method of characterizing printed feature patterns having different OPC designs is provided. A first OPC design, having a first set of features, forms an input data set and is characterized by spatially measuring critical dimensions of the features. The measured segments from various portions of the features are then combined and presented in a graphical sequence as an image (e.g., a computer monitor display). Another OPC design providing comparable features is also then similarly characterized as a data set and presented as a graphical overlay to the previous image. From the graphical comparison of the two data sets, an efficient and rapid determination may be made as to which design provides the best representation of a desired feature. By graphically observing the displayed features as an overlay, performance characteristics of each OPC design, such as corner rounding, pull-back, and end rounding may be efficiently determined.

Another aspect of the present invention relates to a system for evaluating optical proximity corrected (OPC) designs. The system includes a measurement system for performing measurements relating to a feature pattern having a respective OPC design. The measurement system is configured to characterize at least a portion of the feature pattern as a first image based on the measurements and to employ a second image to facilitate analysis of the first image, whereby a comparison of the first and second images facilitates evaluation of corresponding OPC designs.

Yet another aspect of the present invention relates to a system for optimizing OPC design factors. The system includes a measurement system for providing measurement data from an OPC corrected structure. A processing system operatively coupled to the measurement system is configured to analyze the measurement data from the OPC corrected structure over a predetermined area of the structure. The processing system provides OPC design performance information based upon the measurement data within the predetermined area.

Still another aspect of the present invention relates to a method for optimizing optical proximity correction (OPC) for a mask feature. The method includes measuring corresponding segments of at least two feature patterns having different OPC corrections to provide a set of measurement data for each of the different OPC corrections. The different OPC corrections are characterized based on the respective measurement data set. Performance characteristics for each OPC correction are determined based on an evaluation of each OPC characterization.

Another aspect of the present invention relates to a method for optimizing optical proximity correction (OPC) for a mask feature. The method includes using atomic force microscopy to perform measurements on a feature pattern having a respective OPC design and to provide measurement data according the measurements. The measurement data is evaluated to determine performance characteristics of the respective OPC design, such as, for example, corner rounding, pull-back, and end rounding may be efficiently determined. The measurement data also may be compared with a simulated ideal feature pattern to determine statistically a level of error between the feature pattern and that intended to facilitate selection of an optimized OPC design.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
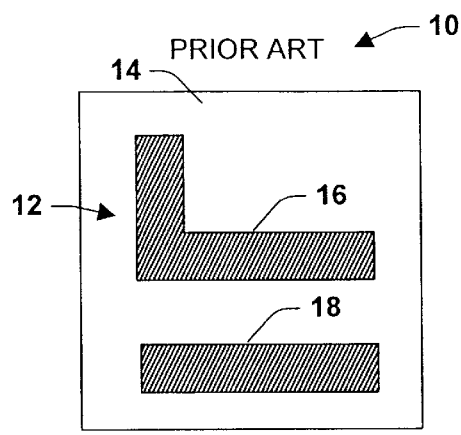
FIG. 1 is a plan view illustrating prior art mask layout data for various features.
Figure 2:
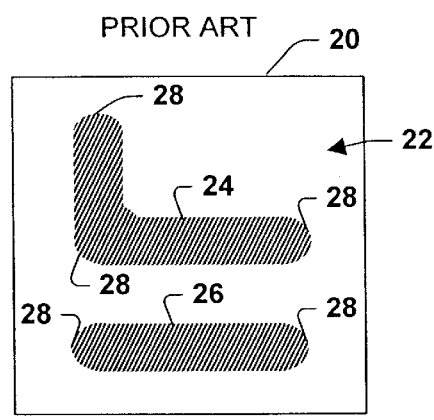
FIG. 2 is a plan view illustrating feature rounding on a substrate manufactured with a reticle having the mask layout data of FIG. 1.
Figure 3:
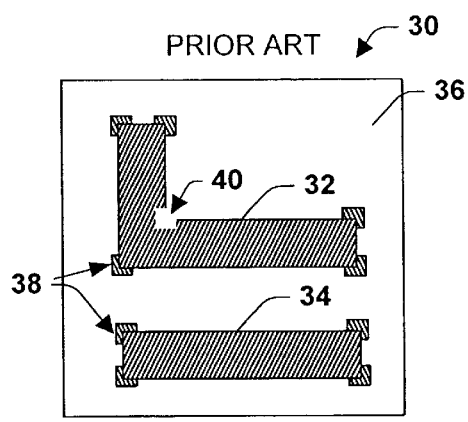
FIG. 3 is a plan view illustrating prior art mask layout data for various features employing conventional optical proximity correction.
Figure 4:
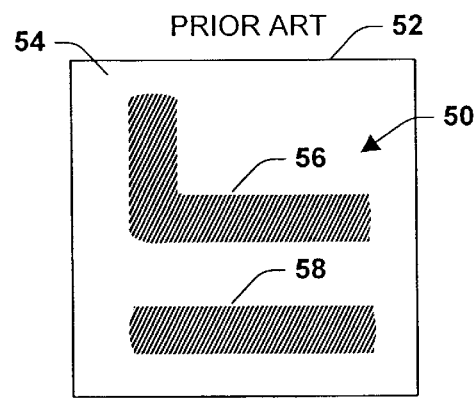
FIG. 4 is a plan view illustrating reduced feature rounding on a substrate manufactured with a reticle having the mask layout data of FIG. 3.
Figure 5:
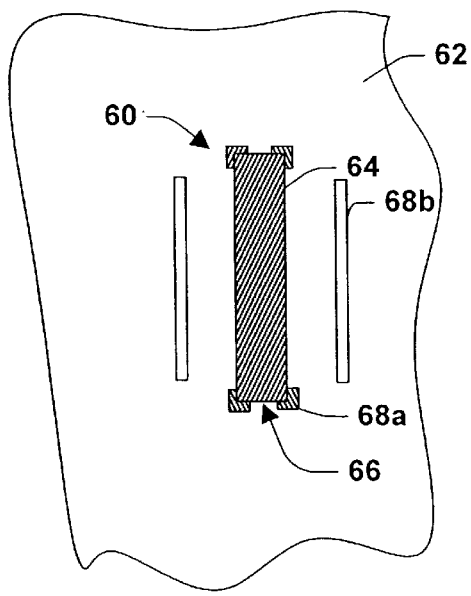
FIG. 5 is a fragmentary plan view of a prior art mask feature employing an OPC design.
Figure 6:
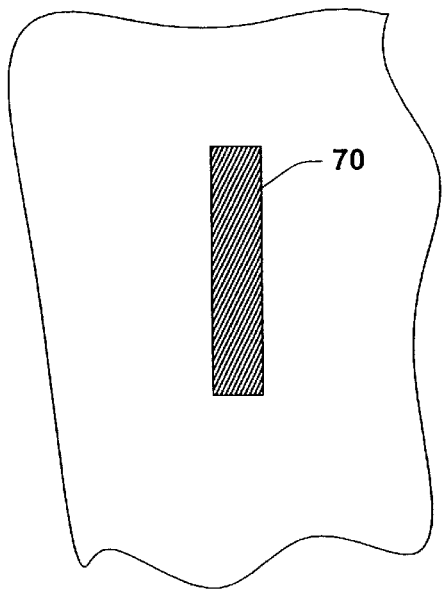
FIG. 6 is a fragmentary plan view of an ideal feature corresponding to the feature of FIG. 5.
Figure 7:
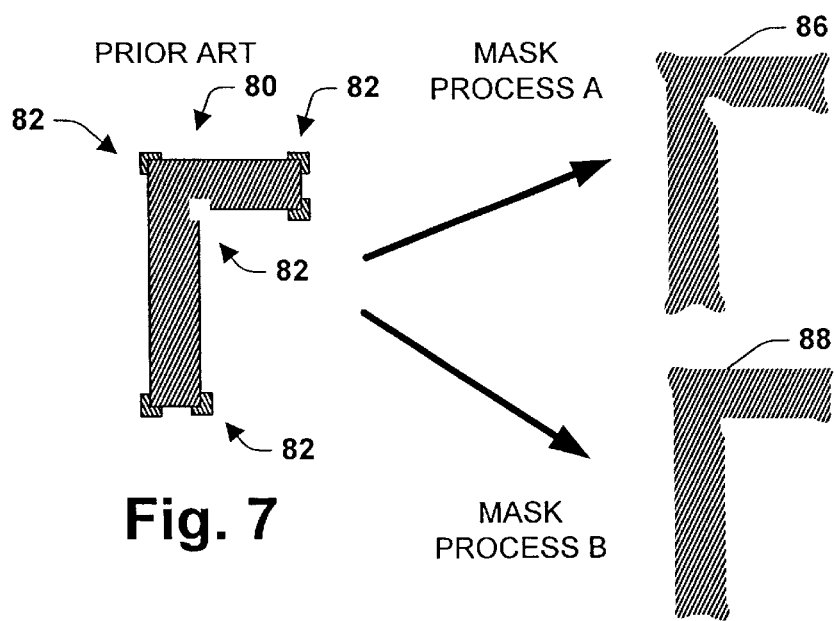
FIG. 7 is a plan view illustrating prior art mask layout data showing a mask pattern having optical proximity correction and two generated mask patterns which were formed using different mask fabrication processes.

The present invention will now be described with reference to the drawings, wherein like reference numerals are used to refer to like elements throughout.

The present invention relates to a system and method of characterizing features employing differing OPC designs. In one aspect of the invention, one or more portions of a feature from a first OPC design are defined and measured by an AFM system over a feature's surface area, such as along a selected critical dimension thereof. The measurements are combined to determine a shape (e.g., a graphical outline) over a given area of the feature. A corresponding feature from another OPC design may then be similarly characterized. The resultant shapes are then subjected to graphical and/or mathematical analysis, in accordance with the present invention, to select an OPC design which yields the optimal pattern transfer characteristics (e.g., closest to that desired). Alternatively, OPC designs may be qualified by analyzing a feature in conjunction with an idealized model of the desired feature. The analysis may include, for example, mathematical regression and/or subtraction techniques to determine relative dimensions and/or error between the actual feature and the idealized feature.

The present invention also provides a system and method for characterizing mask features that have been subjected to alternative mask fabrication processes. By employing graphical and/or numerical evaluation as described above to feature patterns of mask features which have undergone alternative fabrications, a rapid and efficient evaluation may be performed and a process may be selected which provides feature characteristics that are closest to a desired feature.

Figure 8:
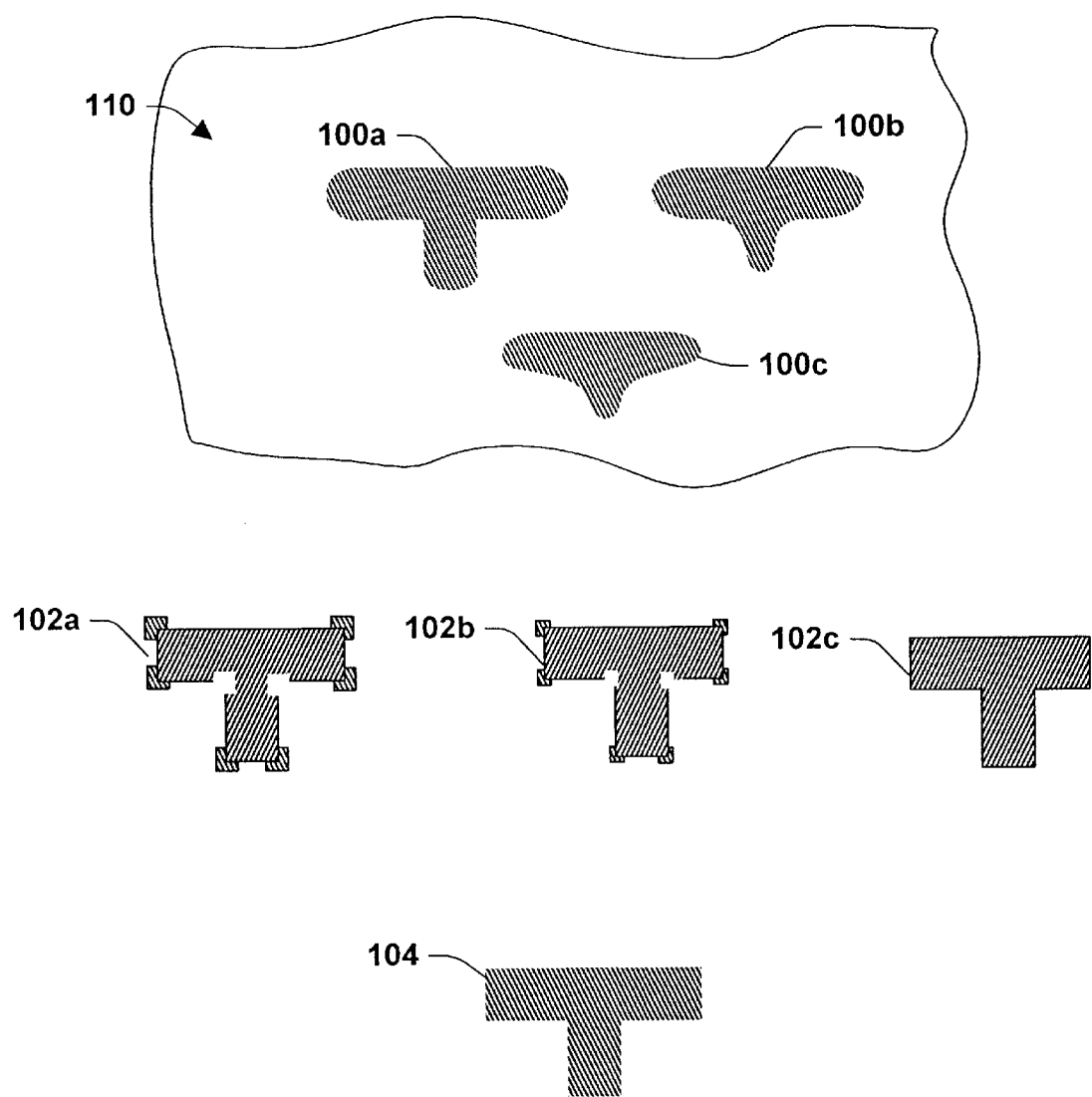
FIG. 8 is a plan view of multiple features which have been fabricated from different OPC designs.

Turning now to FIG. 8, feature patterns 100a, 100b, and 100c are depicted which have been formed in a resist or on a wafer 110 in accordance with OPC designs 102a, 102b, and 102c, respectively. OPC mask designs 102a and 102b represent alternative OPC designs configured for producing an ideal feature 104. Design 102c represents a mask design employing no OPC correction, which produces feature pattern 100c. After the feature patterns 100a, 100b, and 100c have been produced on the wafer 110, an AFM system (see, e.g., 200 of FIG. 13) is employed to provide measurement information over selected portions of the features. Preferably, the measurements are taken along one or more selected critical dimensions (e.g., cross-section, such as length, width, depth) of each feature. From the measurements, graphical and/or mathematical analysis may be employed to determine, in accordance with the present invention, which OPC design 102a or 102b provides the most desirable feature pattern (e.g., one that most closely approximates the ideal feature 104).

Figure 9A:
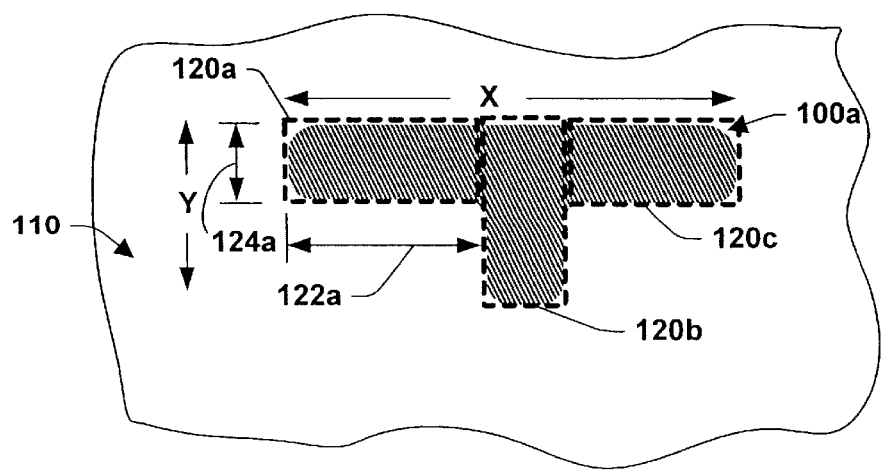
FIG. 9a illustrates a feature pattern corresponding to a first OPC correction in accordance with the present invention.

FIG. 9a illustrates segmented regions of the feature 100a from which a graphical outline of the feature 100a may be determined. By way of example, segment shapes 120a, 120b, and 120c (e.g., rectangles, circles, ovals, boxes, etc.) are aligned to desired areas of the feature 100a. The shapes may be displayed as contrasting pixels to those of the feature 100a and may be determined either manually or by the AFM system. It is to be appreciated that three shape segments 120a, 120b and 120c are shown for purposes of explanation, although other numbers of segments may be employed. For example, given a simple feature, such as a single line feature, a single segment may be employed to define the feature. For more complicated features than depicted in feature 100a, a plurality of segments greater than three may be desirable to define the feature. Alternatively, one may derive the graphical outline of the feature 100a from a scan of the entire feature 100a as a unitary segment regardless of its configuration.

If the segment shapes are determined manually, the shapes may be drawn via graphics software and a mouse as is well known in the art. Alternatively, the AFM system may determine the shapes by highlighting pixels at the boundaries of the contrasting region of the feature 100a and the wafer 110. Once the shapes 120a, 120b, and 120c have been determined and aligned, X and Y coordinates are then established for each of the defined shapes. For example, according to shape 120a, an X dimension 122a may be determined as 1 micron and the Y dimension 124a may be determined as 0.25 micron. The coordinate determinations may be made when defining the pixel shapes as described above. For example, a coordinate dimension may be determined by counting the number of contrasting pixels that appear between the edges of the defined region 120a. After the region coordinates X and Y for the desired shape have been determined, detailed measurements of the defined area are then directed by the AFM system.

Figure 9B:
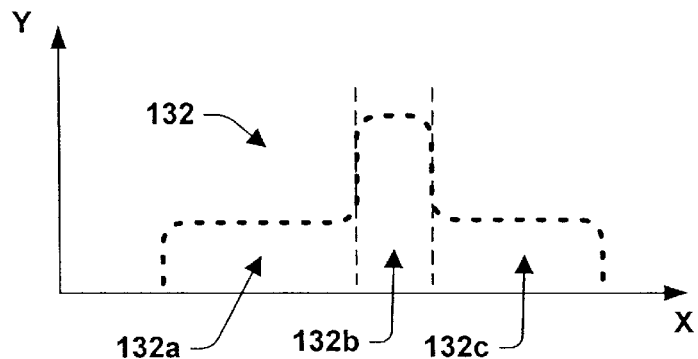
FIG. 9b illustrates a graphical representation of the measurements of the feature pattern of FIG. 9a in accordance with the present invention.

Defined area measurements of a feature region may be achieved by directing a plurality of AFM measurements over the defined region of each shape segment 120a, 120b, 120c. Beginning at a first interval portion of segment 120a, an AFM measurement slice 130a is taken over the Y dimension 122a. According to the resolution of the AFM system, or in accordance with predetermined measurement intervals, succeeding measurement slices of the feature along the X interval are taken over the Y dimension. After a plurality of measurement slices have been taken along the Y dimension for segment 120a, a graphical construction of the measurements is shown as region 132a in FIG. 9b. Referring back to FIG. 9a, shaped segments 120b and 120c are similarly measured by the AFM system. As shown in FIG. 9b, graphical construction of shapes 120b and 120c are depicted as regions 132b and 132c, respectively. The collective sequence of graphical regions 132a, 132b, and 132c is herein referred to as the image 132 of the feature pattern 100a. Each of the plotted values along the Y-axis in the graphical representation of FIG. 9b correspond to measured feature boundaries over the Y-dimension for a given X coordinate. While the plotted values are illustrated as discrete measurement values, it is to be appreciated that a continuous graphical representation may be created, for example, by interpolating between plotted measurement values.

Figure 10A:
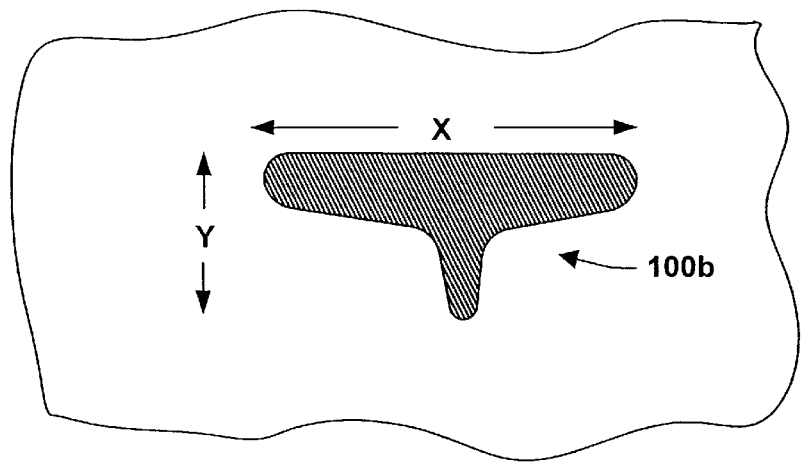
FIG. 10a illustrates another feature pattern corresponding to a second OPC correction in accordance with the present invention.
Figure 10B:
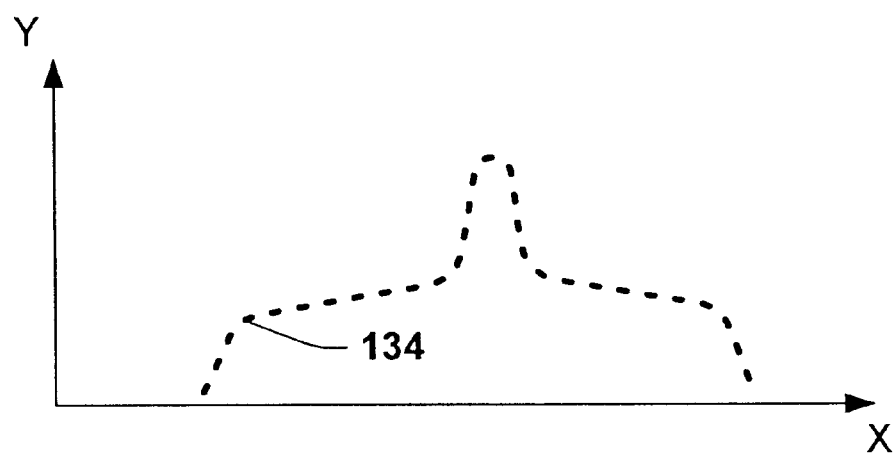
FIG. 10b illustrates a graphical representation of the measurements of the feature pattern of FIG. 10a in accordance with the present invention.

Referring to FIGS. 10a and 10b, the feature 100b is also scanned and measured as described above. Briefly stated, the AFM system scans the feature pattern 100b along the same critical dimension (e.g., the Y dimension) as the other feature 100a is scanned and corresponding measurement data is stored in memory of the AFM system. Preferably, the same AFM dial interval along the X direction is employed so that, as shown in FIG. 10b, a graphical image 134 of the feature pattern 100b is produced from corresponding measurement data so as to have substantially similar resolution to image 132.

Figure 11:
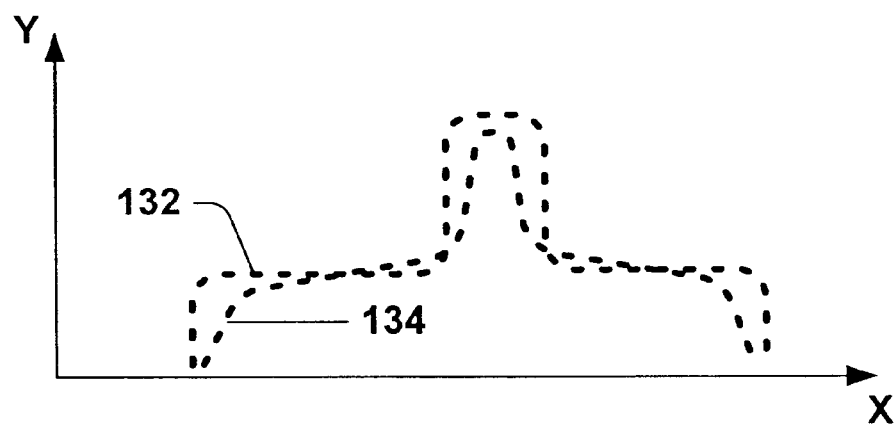
FIG. 11 illustrates a graphical comparison of features employing differing OPC designs in accordance with the present invention.

Referring to FIG. 11, the results of the measurements of feature 100b are then plotted as an overlay image 134 to the image 132 plotted from the feature 100a. Images 132 and 134 are shown as an overlay according to the segment measurements of features 100a and 100b. As may be readily observed from the overlay, the graphical construction 132 associated with feature 100a is a more true representation of the desired feature 104 depicted in FIG. 8. The graphical construction 134 depicts a much rounder version of the desired feature 104 pattern (FIG. 8). Therefore, based on a graphical comparison, one may determine quickly that the feature pattern associated with OPC design 102a better approximates the desired feature pattern 104 than OPC design 102b.

According to another aspect of the present invention, features 100a and 100b depicted in FIG. 8, for example, may be derived from the same OPC design, but employ alternative mask fabrication processes. By applying the graphical analysis of the present invention as described above, and/or numerical analysis described below, a mask fabrication process may be selected which provides the best approximation of an ideal feature 104.

Additionally, a plurality feature patterns 100a and 100b may be derived from the same feature mask, but be patterned onto the wafer employing different lithography processes. For example, a plurality of OPC designs may be employed to pattern printed features over a range of focus and exposure settings. That is, a plurality of feature patterns will be provided for each OPC design. By applying the graphical analysis, in accordance with the present invention, an OPC design may be selected which provides the optimum operating characteristics (e.g., less errors relative to an ideal feature) over a desired range of focus and exposure errors.

The graphical comparison of feature patterns from alternative OPC designs and/or processes, provides a substantially more rapid and efficient method for analyzing competing designs. According to conventional systems, measurements are taken from various portions of a feature. Based upon the measurements, manual data analysis often includes exhausting and time consuming subjective determinations of the various measurements. The analysis increases in complexity as the number of competing OPC designs and/or lithography processes increases. In accordance with the present invention, substantial mitigation of manual analysis of data is achieved. By overlaying competing OPC designs according to defined feature segments, one may rapidly determine via a quick and efficient visual analysis which OPC design should be selected. Additionally, since, in accordance with one aspect of the present invention, features are defined according to segments, a portion of one OPC design may provide a more accurate representation of a corresponding first portion of the ideal feature 104, while a portion from a second OPC design may provide a more accurate representation of a corresponding second portion of the ideal feature 104. This enables desired feature segments from competing designs to be efficiently selected and combined for subsequent determinations of ideal OPC designs and/or fabrication processes. The AFM system also provides an in-line process for evaluating and selecting an optimum OPC design.

In accordance with another aspect of the present invention, features are analyzed with respect to a simulated ideal model of the intended feature. This enables the AFM system, which is described in more detail below to perform a substantially objective analysis on a feature pattern and substantially automate the OPC evaluation process. The analysis may be performed via an image overlay comparison of the measured feature and the idealized model. By determining differences between the model and the feature, the feature, and hence, the OPC design may be substantially objectively analyzed. Thus, considerable time and expense may be saved over conventional manual analysis systems. Additionally, mathematical analysis techniques, such as regression, may be applied to evaluate the differences between the ideal model and the feature.

Figure 12A:
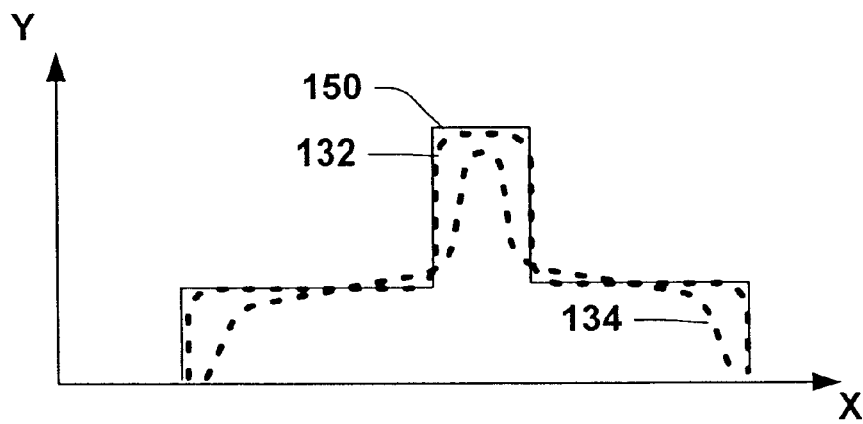
FIG. 12a illustrates a comparison of an idealized feature and features employing differing OPC designs in accordance with the present invention.

Referring now to FIG. 12a, the graphical constructions 132 and 134 of scanned features 100a and 100b, respectively, are aligned with a model 150 of the ideal feature 104. The alignment, may occur graphically and within the AFM memory (described below). The memory region defined by the model 150 defines an enclosed data set (e.g., pixels) within the AFM memory. The scanned features 100a and 100b are defined by second and third data sets. In accordance with an aspect of the present invention, a pixel by pixel (or point by point) comparison may be performed between the data sets to determine the degree of overall difference between each of the image data sets and the model data set. For example, the differences may be quantified as a critical shape error which characterizes the difference in the actual pattern of the feature profile from the desired pattern. The critical shape error further may account for differences between the actual pattern of the feature profile and the desired pattern along two or more dimensions of the feature pattern (e.g., along both the X and Y dimensions or along X, Y and Z dimensions (Z corresponding to feature depth).

By way of example, after comparing the two feature data sets with the model data set, it may be determined that there are 20 percent differences between the region defined by the model 150 and the region defined by the feature for a first corresponding OPC design. When analyzing a second OPC design, the AFM system may determine that only 10 percent differences exist between the model 150 data set and the feature data set. The system may also be configured to report the overall ranking of the OPC designs and the objective results of the analysis.

According to another aspect of the present invention, a more detailed analysis may be performed on the differences between the model 150 and the image 134. For example, objective criteria of feature evaluation may include the degree of corner rounding, the degree of end rounding, and the degree to which lines have pulled-back (line length shorter than the intended dimension because of rounding). The analysis also may rank individual segments of each feature pattern according to selected objective criteria so that OPC designs associated with each segment having the lowest error value may be combined to provide a composite OPC design which provides optimum performance characteristics.

Figure 12B:
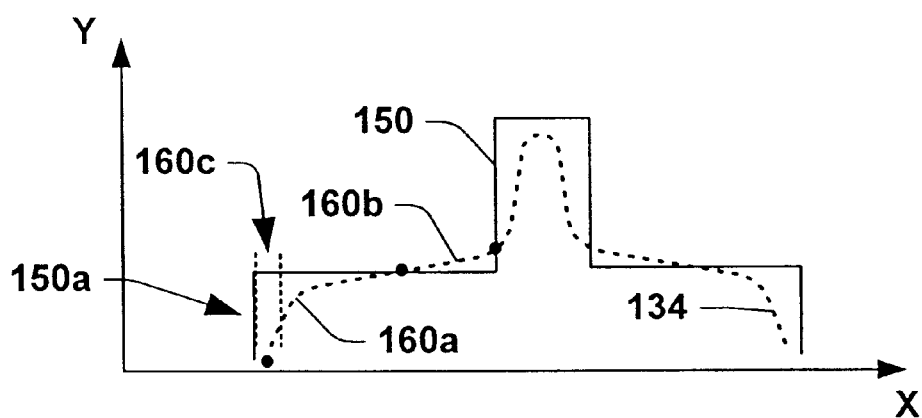
FIG. 12b illustrates a comparison of an idealized feature and an OPC feature in accordance with the present invention.

The degree of either corner or end rounding may be determined by analyzing a portion of the feature data set defined by a region of the model 150. For example, referring to FIG. 12b, the graphical construction 134 is compared with the model feature 150. The outermost data pixels 160a, which approach an end 150a of the idealized feature 150, define a curved relationship and may be characterized according to the degree of end rounding. Likewise, the pixels 160b may be characterized according to the degree of corner rounding. By selectively determining which portion of the idealized model to analyze, the AFM system (e.g., 200 of FIG. 13) may be configured to qualify regions according to predefined regions of the model. Line pull-back, which is shown as reference numeral 160c, may be determined, for example, by analyzing the pixel distance between the end of the feature 160a and the end of the model 150a.

In accordance with the present invention, a curve fitting analysis may be applied to the pixel data set described above to determine the pixel data set shape (e.g., flat shape, parabolic shape) in the measured region. Many techniques are available for fitting particular data to a linear region or to a curve. By way of example, a linear and/or polynomial regression may be employed to determine the amount of flatness or curvature in the desired region. It is to be appreciated, however, that many other well known methods for curve fitting and/or regression may be applied to determine the shape of the desired region and each such method is contemplated as falling within the scope of the present invention.

According to a particular aspect of the present invention, "best fit" criteria is employed for determining whether a given data set is more closely modeled by a linear or polynomial equation. The best fit may be determined by performing a statistical analysis on the actual data in conjunction with predicted data values of the linear or polynomial equations. Based upon the outcome of the statistical analysis, a determination is made as to whether the data is more closely related to the linear model and/or to the higher order polynomial model. For example, if the pixel data set 160a described in FIG. 112b is relatively linear (e.g., straight arrangement of pixels), the statistical analysis will show a substantially higher correlation (e.g., better fit, best fit criteria closer to 1 as described in more detail below) for the linear model than the polynomial model. By utilizing the best fit criteria, OPC designs may be objectively evaluated as to which designs provide the closest fit to the model in relation to the portion of the feature being evaluated.

An exemplary set of equations will now be described in more detail to further illustrate the workings of the present invention. A linear equation for fitting a set of data is shown in Equation 1.

$y = a_0 + a_1 X + e$ (wherein e represents the residual or error between the mathematical model and the actual data). Equation 1:

This equation may be extended for equations of a higher order as shown in Equation 2.

$y = a_0 + a_1 X + a_2 X^2 + \ldots + a_m X^m + e$  Equation 2:

An approach to fitting the actual data (determining the coefficients to the above equations) to Equations 1 and 2, is to minimize the sum of the squares of the residuals as shown in Equations 3 and 4.

$$Sr = \sum_{i=1}^{n} e_i^2 = \sum_{i=1}^{n} (y_i - a_0 - a_1 X)^2 \qquad \text{Equation 3:}$$

wherein Sr represents the sum of the squares of the residuals.

$$Sr = \sum_{i=1}^{n} (y_i - a_0 - a_1 X - a_2 X^2 - \ldots - a_m X^m)^2 \qquad \text{Equation 4:}$$

From these equations, a coefficient of determination may be determined. The coefficient of determination is then employed to determine whether the data is best fit to a linear equation and/or polynomial equation. The coefficient of determination or $r^2$ may be determined as follows:

$r^2 = (S_t - S_r)/S_t$.  Equation 5:

wherein $S_t$ is the total sum of the squares around the mean of the dependent variable y and represents the uncertainty associated with the dependent variable prior to regression. If $r^2$ is close to the value of 1 after applying Equation 5, then the actual data is closely or best fit to the linear or polynomial equations described above. The following discussion is related to a numerical example to illustrate the workings of the present invention.

Curvature of the pixel data set may be obtained, for example, by fitting an $m^{th}$ order polynomial to the pixel data as shown in Equation 2. Alternatively, Equation 1 may applied to determine if the data points are best fit to a linear equation. For example, a second order polynomial (generally having a parabolic or curved shape) may be fit to the pixel data representing the curved portion 160a. Equation 2 and Equation 4 may be manipulated to form a set of equations for determining the coefficients of an $m^{th}$ order polynomial to fit the given data as shown in Equations 6 through 8.

$a_0 n + a_1 \Sigma Xi + a_2 \Sigma Xi^2 + \ldots + a_m \Sigma Xi^m = \Sigma Yi$  Equation 6:

$a_0 \Sigma Xi + a_1 \Sigma Xi^2 + a_2 \Sigma Xi^3 + \ldots + a_m \Sigma Xi^{m+1} = \Sigma XiYi$  Equation 7:

$a_0 \Sigma Xi^2 + a_1 \Sigma Xi^3 + a_2 \Sigma Xi^4 + \ldots a_m \Sigma Xi^{m+2} = \Sigma Xi^2 Yi$  Equation 8:

whereby n is the number of points to be fit, and m is the degree to which the data points are to be fit.

By selecting a threshold for $r^2$ as shown in Equation 5 above, a substantially objective determination may be made as to the quality of a desired region of a feature. For example, a linear and polynomial equation may be fit to a given data set for a desired region of a feature. If the $r^2$ computation were to confirm a high correlation ($r^2$ approximately equal to 1) to the linear model for the region of interest, then a detennination may be made that the OPC design for that region provided a substantially close (statistically speaking) approximation to the ideal feature 150. Thus, the numerical analysis of the optically corrected region would provide a substantial improvement over manually driven conventional systems.

Figure 13:
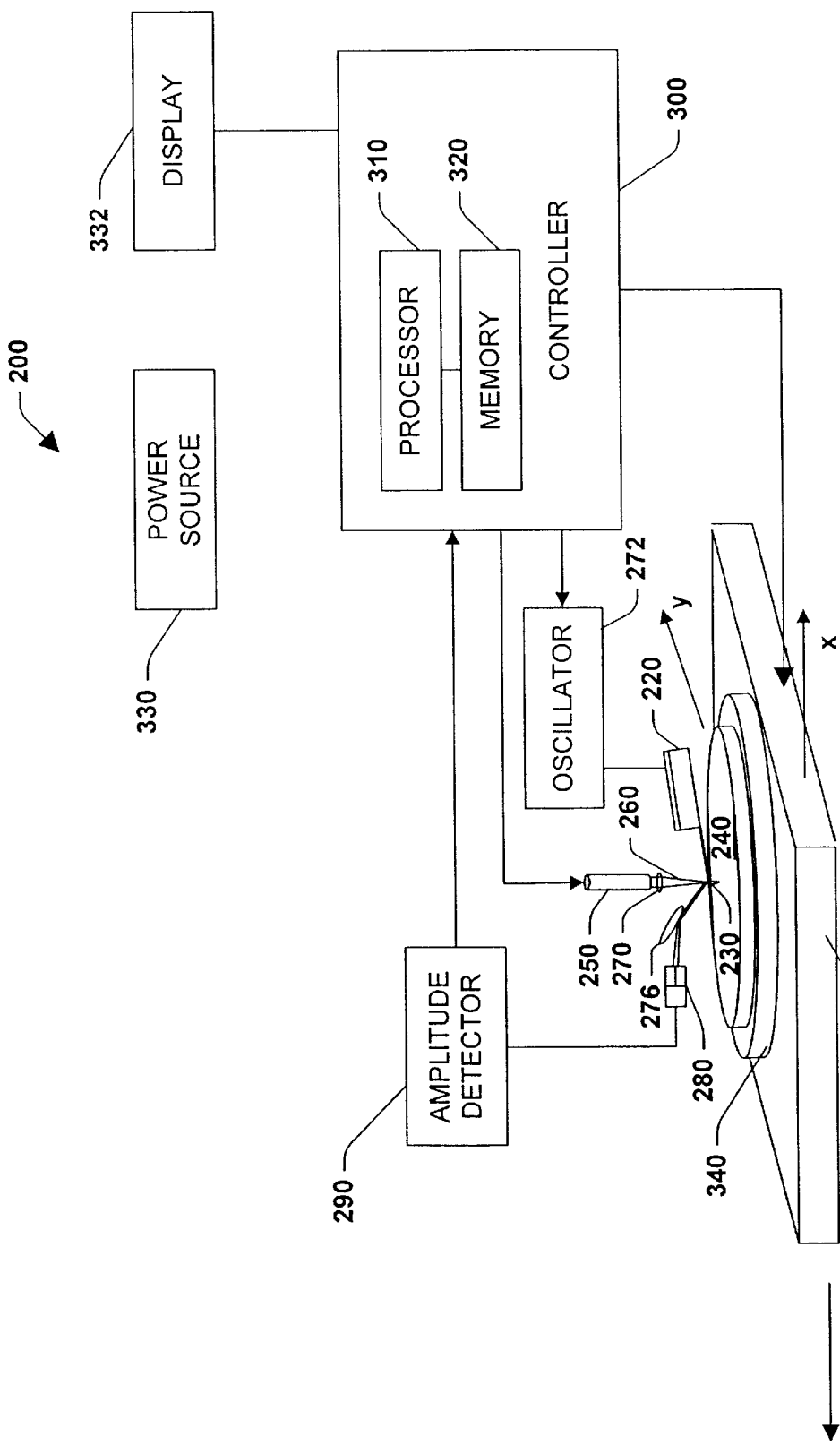
FIG. 13 illustrates an AFM system for measuring and evaluating OPC designs in accordance with the present invention.

Now referring to FIG. 13, an AFM system 200 is shown for providing feature analysis and OPC evaluation in accordance with the present invention. The system 200 includes a cantilever 220 having an atomically sharp tip 230 that is brought very close to the surface of the sample wafer 240 being analyzed. The tip 230 responds to chemical attraction or repulsion from the wafer 240 which moves the tip up or down relative to its supporting cantilever 220 as the wafer surface is scanned. Movement of the tip 230 provides an indication of various surface properties of the wafer 240 (e.g., topography, friction, hardness, etc.). Movement of the tip 230 is monitored to provide measurement data from which an image is generated indicative of the surface properties of the wafer and features patterned thereon.

FIG. 13 schematically illustrates an AFM system 200 configured to operate in a tapping mode, although the AFM may be configured to operate in a contact mode or non-contact mode. A light source, such as a laser 250, emits a laser beam 260 through a focusing lens 270 onto the tip 230. A high resolution oscillator 272 is operatively associated with the cantilever 220 for effecting oscillation of the tip 230 at a desired oscillation amplitude. The oscillation amplitude is set sufficiently high (e.g., 10–100 nm) so that when the tip 230 taps on the wafer 240 surface, the cantilever 220 has adequate restoring force to prevent the tip from being trapped at the surface. The cantilever 220 is oscillated at or near its resonant frequency (often hundreds of kilohertz) as it is scanned over the wafer 240 surface. The tip 230 is positioned sufficiently close to the wafer 240 surface to intermittently contact (e.g., tap) on the surface. The contact causes the oscillation amplitude to be reduced. As a result, the oscillation amplitude scales in direct proportion to the average distance of the tip 230 to the wafer 240 being sampled. By way of example, if the average separation between the tip 230 and wafer 240 is 10 nm, then the tip oscillation amplitude will be about 20 nm peak-to-peak.

As the cantilever 220 flexes due to contact with the wafer 240, the beam 260 from the laser 250 is reflected or diffracted by the tip or cantilever. As a result, up or down movement of the tip 230 is detected based on changes in the reflected laser beam 260 position. In this example, the laser beam 260 is reflected by a reflector 276 onto a photodetector 280 formed of a split photodiode. The photodetector 280 provides an output signal, which may be a differential signal corresponding to the difference in the signals of each part (e.g., A and B) of the split photodiode. The photodetector signal is provided to an amplitude detector 290 which processes the photodetector signal. The amplitude detector 290 is configured to determine the oscillation amplitude of the tip 230 based on the photodetector signal. The amplitude detector 290 provides an output signal to a controller 300 indicative of the detected oscillation amplitude. In addition, the amplitude detector 290 and/or the controller 300 may also provide amplification, filtering or other signal processing of the received signal. The amplitude detector 290 preferably digitizes the information for further processing by the controller 300.

The controller 300 includes a processor 310 which is programmed to control and operate the various components within the system 200 in order to carry out the various functions described herein. By way of example, the processor 310 controls the high resolution oscillator 272 operatively associated with the cantilever 220 for producing a desired oscillation amplitude of the tip 230. Additionally, the processor 310 may be programmed and/or configured to control operation of the laser 250 and the scanning interval at which the tip 230 is scanned over the wafer 240 surface. The processor 310 also provides critical dimension measurements and performs signal analysis thereof in accordance with the present invention. It is to be appreciated that a plurality of processors and/or processing systems may be included as part of and/or external to the AFM system 200 for performing signal analysis in accordance with the present invention. Signals received from wafer 240 surface measurements are digitized and analyzed as a data set. By analyzing the measurement data, a graphical construction (e.g., a shape or image) for the data set may be determined to qualify the effectiveness of an OPC design. The manner in which the processor 310 may be programmed to carry out the functions relating to the present invention will be readily apparent to those having ordinary skill in the art based on the description provided herein.

A memory 320 which is operatively coupled to the processor 310 is also included in the controller 300 and serves to store program code executed by the processor 310 for carrying out operating functions of the system 200 as described herein. The memory 320 includes, for example, read only memory (ROM) and random access memory (RAM). The RAM is the main memory into which the operating system and application programs are loaded. The memory 320 also serves as a storage medium for temporarily storing information such as measurement data (e.g., amplitude and tip position relative to the wafer surface), wafer position, curve fitting data, critical dimension data, statistical data, programs for determining feature profiles from measurement data, and other data which may be employed in carrying out the present invention. For mass data storage, the memory 320 may also include a hard disk drive (e.g., 50 Gigabyte hard drive).

A power source 330 provides operating power to the system 200, including its various component parts. Any suitable power source (e.g., battery, line power) may be employed to implement the present invention.

The system 200 also includes a precise positioning device to effect movement of the wafer 240 or the tip 230 for scanning selected portions of the wafer surface. Typically, the tip 230 is scanned in a raster pattern across the wafer surface by a suitable positioning system. Alternatively, the wafer may be situated on a precise positioning system which moves the wafer 240 relative to the probe tip 230 in a desired raster pattern. For example, the system may include a wafer holder 340 which vacuum-adsorbs a wafer 240 thereon. The wafer holder 340 may be provided for slight rotation relative to a stage 350 two-dimensionally moveable in an x-direction and y-direction. The stage 350 and wafer holder 340 are controlled by the controller 300. The controller 300, for example, effects movement of the stage 350 (via a plurality of motors (not shown)) to provide corresponding movement of wafer 240 in a precise, predetermined raster pattern for scanning.

Rastering the tip 230 across the wafer surface produces measurement data from which the controller 300 produces a topographic image (e.g., a graphical outline) of the features on the wafer surface with atomic resolution. A critical dimension image may also be directed to an associated display 332 by the controller 300. The controller 300, in addition to analyzing received measurement data, may synchronize the scanning of the display with scanning of the wafer 240 by the tip 230 to provide the image.

Figure 14:
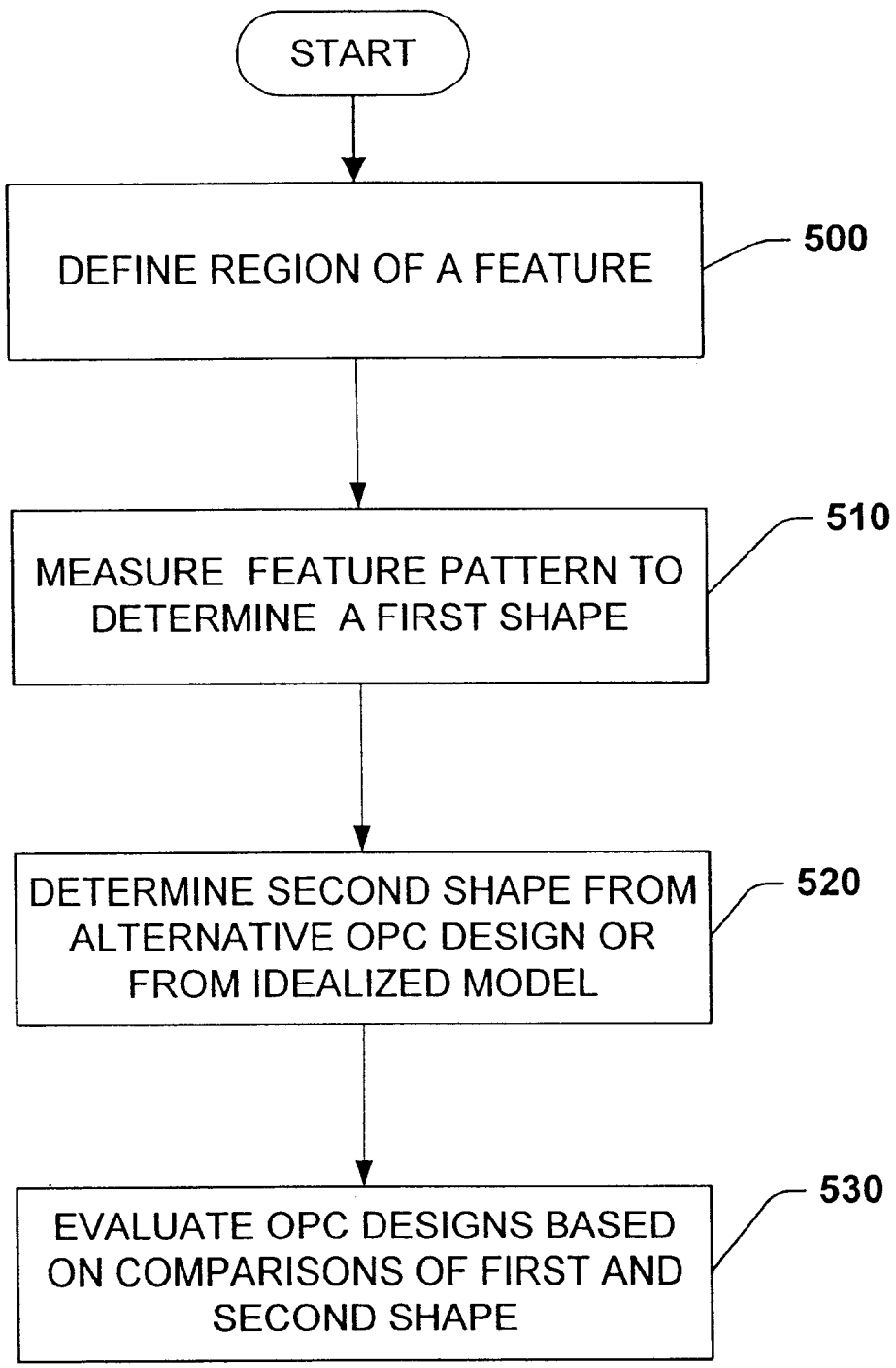
FIG. 14 illustrates a flow diagram methodology for evaluating OPC designs in accordance with the present invention.

Now referring to FIG. 14, a flow chart illustrates a methodology for evaluating OPC designs in accordance with the present invention. At step 500, a region is defined for at least a portion of an optically corrected feature pattern. As described above, the region may be the entire feature or a portion thereof defined by a shape, such as a rectangle, which may be either manually determined or determined by the system based on the contrast of the feature outline. Proceeding to step 510, the shape which was defined in step 500 is measured (e.g., according to a set of sequential measurements by the AFM system) across the area defined by the shape. Based on the measurements, a feature outline is determined and may be provided to a graphical display (e.g., 332 of FIG. 13) and stored in memory (e.g., 320 of FIG. 13) as a pixel data set.

Proceeding to step 520, a second feature having a different OPC design is characterized as an image as described above in steps 500 and 510. Alternatively, a simulated image corresponding to an ideal feature model may be produced from the geometric outline of the intended feature if the feature were produced and no distortions were to occur from optical effects. From step 520, the process proceeds to step 530.

At step 530, the image of the second feature and/or ideal feature model are displayed as a graphical overlay relative to the first feature image that was defined in steps 500 and 510. By overlaying the features, a rapid visual evaluation may occur as to which OPC design more closely follows the desired or intended feature. Additionally, the ideal model may be employed to determine differences between the OPC corrected feature associated therewith. These differences may be characterized via subtraction techniques as described above, and/or via curve fitting analysis at the corners and edges of the measured feature. While the foregoing example describes the method as analyzing three feature patterns (e.g., two different OPC designs and an ideal feature model), it is to be appreciated that a substantially greater number of feature patterns may be employed in accordance with the present invention to facilitate selection of an OPC design which is a closest approximation of the intended feature pattern.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising".

What is claimed is:

1. A method for optimizing optical proximity correction (OPC) for a mask feature, said method comprising the steps of:

using atomic force microscopy to perform a first set of measurement data on at least one segment of a feature pattern having a respective OPC design and to provide measurement data according the measurements; and evaluating the measurement data to determine a performance characteristics of respective OPC design.

2. The method of claim 1 wherein the measurements relating to the at least one segment of the feature pattern are determined from a sequence of spatial measurements recorded over a critical dimension of the feature pattern.

3. The method of claim 1 wherein another set of measurement data having a different OPC design is employed to facilitate a determination of the performance characteristics for the respective OPC design.

4. The method of claim 3 wherein each measurement data set is employed to provide first and second images which are evaluated graphically.

5. The method of claim 1 wherein a second data set is determined from an simulated model of an ideal feature to facilitate evaluation of the measurement data and determine the performance characteristics of the respective OPC design.

6. The method of claim 5 wherein the measurement data corresponds to a first image and the second data set corresponds to a second image, the first and second images being compared to evaluate the performance characteristics of the respective OPC design.

* * * * *